(12) United States Patent
Okita (10) Patent No.: US 11,355,323 B2
(45) Date of Patent: *Jun. 7, 2022

(54) PLASMA PROCESSING APPARATUS AND METHOD THEREFOR

(71) Applicant: Panasonic Intellectual Property Management Co., Ltd., Osaka (JP)

(72) Inventor: Shogo Okita, Hyogo (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 519 days.

This patent is subject to a terminal disclaimer.

(21) Appl. No.: 15/444,775

(22) Filed: Feb. 28, 2017

(65) Prior Publication Data
US 2017/0178871 A1    Jun. 22, 2017

Related U.S. Application Data

(62) Division of application No. 14/524,303, filed on Oct. 27, 2014, now Pat. No. 9,620,336.

(30) Foreign Application Priority Data

Nov. 1, 2013    (JP) .............................. JP2013-228097

(51) Int. Cl.
*H01J 37/32*    (2006.01)
*H01L 21/683*   (2006.01)
(Continued)

(52) U.S. Cl.
CPC .... *H01J 37/32697* (2013.01); *H01J 37/3244* (2013.01); *H01J 37/32568* (2013.01);
(Continued)

(58) Field of Classification Search
CPC ........... H01J 2237/002; H01J 2237/334; H01J 37/3211; H01J 37/3244; H01J 37/32568;
(Continued)

(56) References Cited

U.S. PATENT DOCUMENTS

| 7,385,799 | B1 | 6/2008 | Purohit |
| 2005/0083634 | A1* | 4/2005 | Breitschwerdt ... H01L 21/67109 361/234 |

(Continued)

FOREIGN PATENT DOCUMENTS

| CN | 101901778 | 12/2010 |
| CN | 102956533 | 3/2013 |

(Continued)

OTHER PUBLICATIONS

Office Action and Search Report dated Dec. 1, 2017 in Chinese Patent Application No. 201410594299.8, with partial English-language translation of Office Action and full English-language translation of Search Report.

(Continued)

*Primary Examiner* — Hua Qi
(74) *Attorney, Agent, or Firm* — Wenderoth, Lind & Ponack, L.L.P.

(57) ABSTRACT

A dry etching apparatus plasma processes a wafer held by a carrier having a frame and an holding sheet. The carrier is placed on an electrode unit of a stage provided in a chamber. The electrode unit is cooled by a cooling section configured to cool the electrode unit. An upper face of the electrode unit is at least as large as the back side of the carrier. The holding sheet and the frame are cooled effectively by the heat transfer to the stage.

11 Claims, 6 Drawing Sheets

(51) Int. Cl.
  *H01L 21/3065* (2006.01)
  *H01L 21/67* (2006.01)
  *H01L 21/78* (2006.01)

(52) U.S. Cl.
  CPC .. *H01J 37/32715* (2013.01); *H01J 37/32724* (2013.01); *H01J 37/32816* (2013.01); *H01L 21/3065* (2013.01); *H01L 21/67069* (2013.01); *H01L 21/6831* (2013.01); *H01L 21/6833* (2013.01); *H01J 37/3211* (2013.01); *H01J 2237/002* (2013.01); *H01J 2237/334* (2013.01); *H01L 21/78* (2013.01)

(58) Field of Classification Search
  CPC ........... H01J 37/32697; H01J 37/32715; H01J 37/32724; H01J 37/32816; H01L 21/3065; H01L 21/67069; H01L 21/6831; H01L 21/6833; H01L 21/78
  See application file for complete search history.

(56) References Cited

U.S. PATENT DOCUMENTS

| | | | |
|---|---|---|---|
| 2008/0017104 A1* | 1/2008 | Matyushkin | H01L 21/67109 118/696 |
| 2010/0216313 A1 | 8/2010 | Iwai | |
| 2011/0096461 A1 | 4/2011 | Yoshikawa et al. | |
| 2012/0160808 A1* | 6/2012 | Kikuchi | H01L 21/6831 216/67 |
| 2012/0238073 A1 | 9/2012 | Johnson et al. | |
| 2012/0322239 A1* | 12/2012 | Singh | B23K 26/36 438/462 |
| 2013/0048217 A1* | 2/2013 | Shiraiwa | H01J 37/32788 156/345.53 |
| 2013/0230974 A1 | 9/2013 | Martinez et al. | |
| 2013/0295775 A1 | 11/2013 | Iwai | |
| 2013/0344683 A1 | 12/2013 | Lazerand | |

FOREIGN PATENT DOCUMENTS

| | | | | |
|---|---|---|---|---|
| JP | 4858395 | 1/2012 | | |
| WO | WO-2012164857 A1 * | 12/2012 | ............ | H01J 37/321 |

OTHER PUBLICATIONS

Office Action with Search Report dated Jun. 22, 2017 in Chinese Patent Application No. 201410594299.8, with partial English-language translation of Office Action and full English-language translation of Search Report.

* cited by examiner

PLASMA PROCESSING APPARATUS AND METHOD THEREFOR

CROSS-REFERENCE TO RELATED APPLICATIONS

This application is a divisional application of copending application Ser. No. 14/524,303 filed on Oct. 27, 2014 which claims priority of Japanese Patent Application No. 2013-228097 filed on Nov. 1, 2013, the contents of which are incorporated herein by reference.

BACKGROUND OF THE INVENTION

Field of the Invention

The present invention relates to a plasma processing apparatus and a method therefor.

Description of Related Art

The plasma processing apparatuses disclosed in Japanese Patent No. 4858395 and United States Patent Application Publication No. 2012/0238073 have process targets of a substrate (wafer, for example) held in a carrier including an annular frame and a holding sheet. The substrate is held on a holding sheet. In addition, these plasma processing apparatuses include a cover that covers a frame and an area between the substrate outer-periphery of the holding sheet and the frame so that the frame and the area are not to be exposed to the plasma.

The cover is heated by being exposed to plasma, and tends to have a high temperature. Radiant heat from the heated cover gives thermal damage to the resist of the substrate outer peripheral part, holding sheet, and frame. As measures against the thermal damage by the radiant heat from such a cover, the substrate and the carrier are electrostatically attracted to and brought into close contact with the stage (cooled by coolant circulation), and can be cooled by the heat transfer to the stage.

In the conventional plasma processing apparatus, when the target of the plasma process is a substrate held by the carrier, there has not been any specific study on in what manner the electrostatic attraction should be performed so that the plasma process performance and the electrostatic attraction performance (cooling performance) can be compatible.

SUMMARY OF THE INVENTION

The present invention has an object to improve both the plasma process performance and the electrostatic attraction performance in a plasma processing apparatus for plasma-processing the substrate held by the carrier.

A first aspect of the present invention provides a plasma processing apparatus for plasma processing a substrate held by a carrier having a frame and a holding sheet, comprising: a chamber having a pressure reducible internal space; a process gas supply section configured to supply a process gas into the internal space; a pressure reducing section configured to reduce pressure of the internal space; a plasma generating section configured to generate plasma in the internal space; and a stage provided in the chamber and including an electrode unit on which the carrier is placed; wherein the electrode unit comprises: an upper face of the electrode unit at least as large as a backside of the carrier; and a cooling section configured to cool the electrode unit.

The electrode unit may support and cool substantially all of the backside of the carrier.

The upper face of the electrode unit may be larger than the backside of the carrier.

The upper face of the electrode unit may be larger than the substrate.

More specifically, the plasma processing apparatus further comprising a first electrostatic attraction electrode of unipolar type incorporated in a first area of the electrode unit, the first area being an area in which the substrate is placed via the holding sheet, and a second electrostatic attraction electrode of bipolar type which is incorporated in a second area of the electrode unit and to which a direct current voltage is applied, the second area including at least an area in which the frame is placed via the holding sheet and an area in which the holding sheet between the substrate and the frame is placed.

More specifically, the plasma processing apparatus further comprising a cover capable of coming into and out of contact with stage. The cover comprises a body covering the holding sheet and the frame of the carrier placed on the electrode unit, and a window formed to penetrate the body in a thickness direction so as to expose the substrate held in the carrier placed on the electrode unit to the internal space.

The substrate is electrostatically attracted by the first electrostatic attraction electrode of unipolar type. A electrostatic attraction force of the unipolar-type electrostatic attraction electrode is weaker than that of the bipolar-type. However, the unipolar-type electrostatic attraction electrode is superior to the bipolar-type in term of the plasma processing performance due to that a whole surface of the substrate can be equally attracted. For example, in the case of plasma dicing, both the attraction force fluctuation of the before and after of singulating the substrate and the difference of the localized attraction force of unipolar type are less than those of bipolar type. In addition, specifically, in the case of the process (Si etching process, for example) where the radical reaction of the high plasma density and the low bias power are dominant, with the change of the bias power of the before and after of singulating the substrate, the pattern of the electrostatic attraction electrode of bipolar type may be transcribed to the substrate side. On the other hand, the frame and the holding sheet (between the substrate and the frame) are electrostatically attracted to the electrode unit by the second electrostatic attraction electrode of bipolar type. The electrostatic attraction electrode of bipolar type is inferior to that of unipolar type in terms of the plasma process performance, but is stronger than that of unipolar type in terms of the electrostatic attraction force. That is, in the present invention, the first electrostatic attraction electrode of unipolar type is used for the electrostatic attraction of the substrate which directly influences the plasma process performance, on the other hand, the second electrostatic attraction electrode of bipolar type with the strong electrostatic attraction force is used for the frame and the holding sheet with less influence on the plasma process performance than the substrate. As a result, both the plasma process performance and the electrostatic attraction performance can be improved. With the improvement of the electrostatic attraction performance, the holding sheet and the frame are cooled effectively by the heat transfer to the stage, and the damage caused by the radiant heat from the cover can be reduced effectively.

The second electrostatic attraction electrode may electrostatically attract the cover. In this structure, the second area includes an area in which the cover comes into contact with the electrode unit.

Alternatively, the second electrostatic attraction electrode does not electrostatically attract the cover. In this structure, the second area does not include the area in which the cover comes into contact with the electrode unit, and a clamp mechanism for pressing the cover onto the state is provided.

A direct current voltage can be applied to the first electrostatic attraction electrode. Alternatively, a voltage obtained by superimposing a radio frequency voltage on a direct current voltage can be applied to the first electrostatic attraction electrode.

The second electrostatic attraction electrode can be disposed without overlapping the substrate.

A second aspect of the present invention provides a method for plasma processing a substrate held by a carrier having a frame and a holding sheet. The method comprises loading the carrier holding the substrate into a chamber of a plasma processing apparatus so that the carrier is placed on an electrode unit of a stage, electrostatically attracting the substrate by a first electrostatic attraction electrode of unipolar type incorporated in the electrode unit, electrostatically attracting at least the frame and the holding sheet by a second electrostatic attraction electrode of bipolar type incorporated in the electrode unit, and generating plasma in the chamber, thereby plasma processing the substrate.

According to the invention, the first electrostatic attraction electrode of unipolar type is used for the electrostatic attraction of the substrate, whereas the second electrostatic attraction electrode of bipolar type is used for the electrostatic attraction of the frame and the holding sheet. This improves both of plasma processing performance and electrostatic attraction performance.

BRIEF DESCRIPTION OF THE DRAWINGS

These and other objects and features of the present invention will become apparent from the following description taken in conjunction with preferred embodiments thereof with reference to the accompanying drawings, in which.

DESCRIPTION OF THE PREFERRED EMBODIMENTS

In the following, an embodiment of the present invention will be described with reference to the accompanying drawings. In the following description, terms indicating particular directions and positions (including such terms as "upper", "lower", "side", and "end") are sometimes used. The use of these terms are intended to facilitate the understanding of the present invention with reference to the drawings, and the technical scope of the present invention is not limited by the meaning of these terms. In addition, the following description is merely exemplary in nature, and it is not intended to limit the present invention, the application thereof, and the use thereof.

First Embodiment

Figure 1:
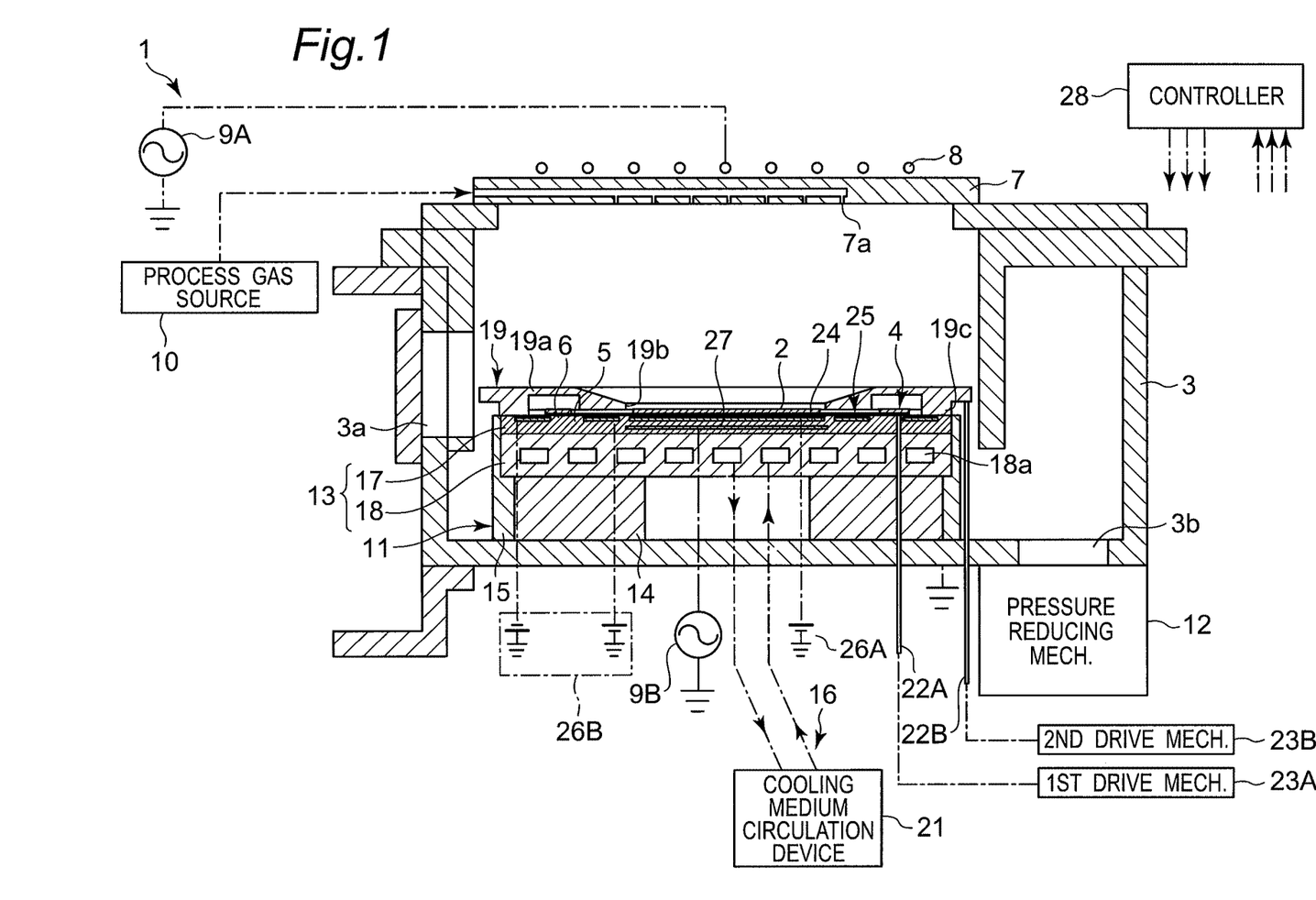
FIG. 1 is a sectional view of a plasma processing apparatus according to a first embodiment of the present invention (a cover is at a lowered position)
Figure 2:
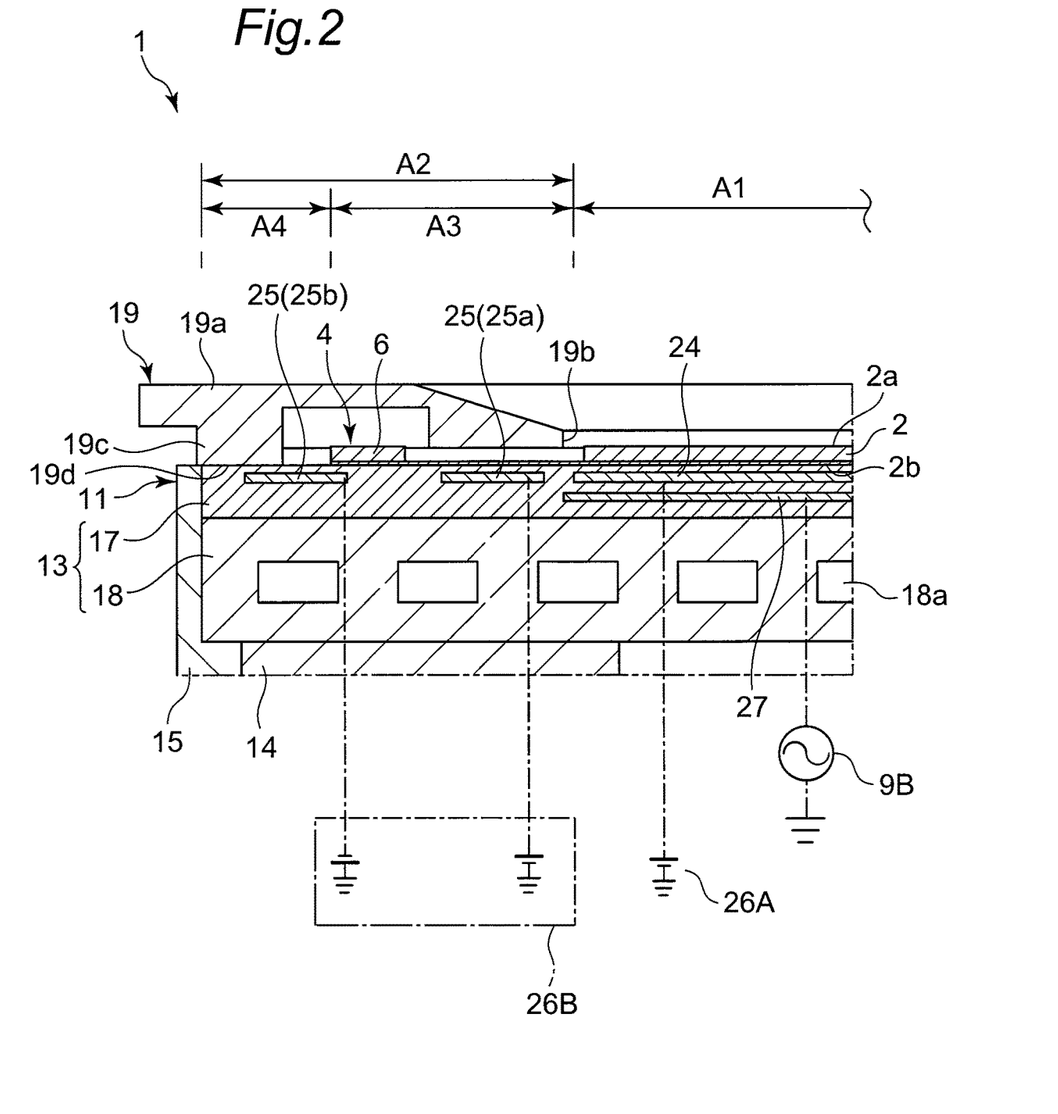
FIG. 2 is a partial enlarged view of FIG. 1.

FIGS. 1 to 4 show a dry etching apparatus 1 which is an example of a plasma processing apparatus according to an embodiment of the present invention. In this embodiment, plasma dicing is performed on a wafer (substrate) 2 by this dry etching apparatus 1. Plasma dicing is a method of cutting, by using a dry etching boundary line (street), the wafer 2 in which a plurality of IC units semiconductor devices) are formed, and dividing the wafer 2 into individual IC units. Referring to FIG. 2, the wafer 2 having a circular shape in this embodiment includes a front face 2a on which IC units, etc., not shown in the figure, are formed, and a back face 2b (on which IC units, etc. are not formed) on the opposite side of the front face 2a. On the front face 2a of the wafer 2, a mask (not shown in the figure) is formed in a pattern for plasma dicing.

Referring to FIG. 1, the dry etching apparatus 1 includes a chamber (vacuum vessel) 3 which has a pressure reducible internal space. A carrier 4 can be accommodated in the internal space through a gate 3a of the chamber 3.

Figure 3:
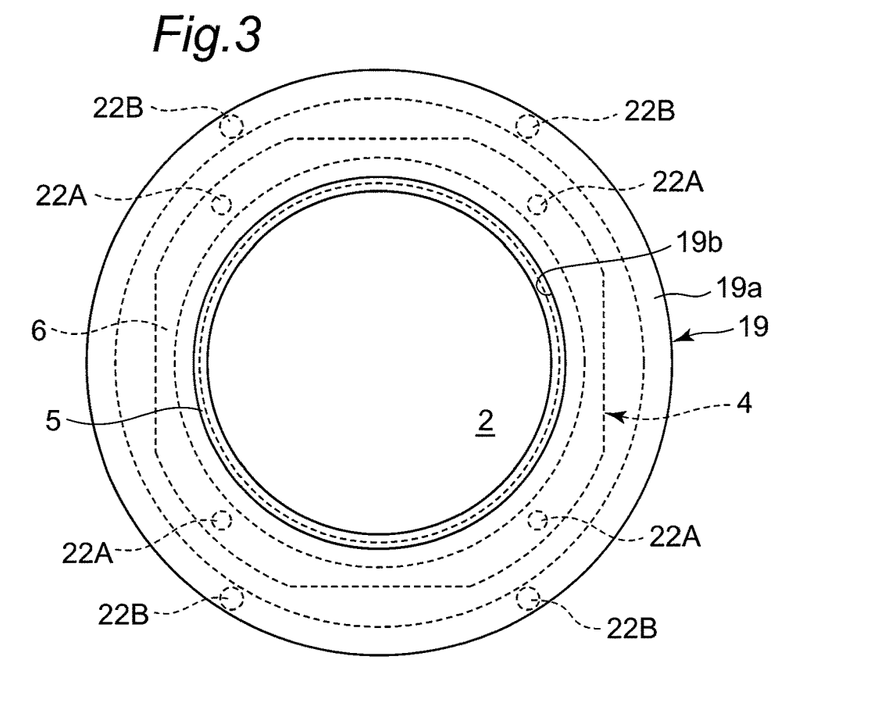
FIG. 3 is a plane view of a carrier arranged on a stage and the cover covering the carrier.

Referring to FIGS. 2 and 3, the carrier 4 includes a holding sheet 5 which detachably holds the wafer 2. As for the holding sheet 5, for example, a UV tape can be used. The UV tape is extendable and holds the wafer 2 by its adhesive force. However, the chemical properties of the UV tape are changed and the adhesive force is greatly reduced by irradiation of ultraviolet rays. The holding sheet 5 has an adhesive face 5a on one face, and a non-adhesive face 5b on the other face. The holding sheet 5 is flexible, flexes easily, and cannot maintain a constant shape only by itself. Therefore, on the adhesive face 5a near the outer peripheral edge of the holding sheet 5, an approximately annular thin frame 6 is adhered. The frame 6 is made of, for example, metal such as stainless steel, and aluminum, or resin, and has a rigidity that can hold the shape together with the holding sheet 5. In the holding sheet 5 in the carrier 4, the wafer 2 is held by the back face 2b being adhered on the adhesive face 5a.

Referring to FIG. 1, above the dielectric wall 7 that closes the top part of the chamber 3 of the dry etching apparatus 1, an antenna 8 is disposed as an upper part electrode. The antenna 8 is electrically connected to a first high frequency power source 9A. The antenna 8 and the first radio frequency power source 9A constitute a plasma generating section. On the bottom part side of the chamber 3, a stage 11 is disposed on which the carrier 4 holding the wafer 2 is placed. The gas inlet port 7a, which is formed in the dielectric wall 7, to the internal space of chamber 3 is connected to a process gas source 10. To the exhaust port 3b of the chamber 3, a pressure reducing mechanism 12 including a vacuum pump for evacuating the internal space is connected.

Referring to FIGS. 1 and 2, the stage 11 includes an electrode unit 13, a base section 14 supporting the electrode unit 13, and an exterior unit 15 surrounding the outer periphery of the electrode unit 13 and the base section 14. The exterior unit 15 is made of a ground shielding material (metal having conductivity and etching resistance). The exterior unit 15 protects the electrode unit 13 and the base section 14 from the plasma. A cooling device 16 is disposed in the stage 11.

The electrode unit 13 includes an electrostatic chuck 17 constituting the top layer of the stage 11, and an electrode unit body 18 made of metal such as aluminum alloy and disposed on the lower side of the electrostatic chuck 17.

The electrostatic chuck 17 of the electrode unit 13 is made of thin ceramics, sprayed ceramics, or a sheet (tape) of dielectric material. The carrier 4 holding the wafer 2 is placed on the central part of the upper face of the electrostatic chuck 17. In addition, on the outer peripheral side part of the electrostatic chuck 17, a cover 19 described below is placed. In the electrode unit 13, first and second electrostatic attraction electrodes 24 and 25 and a bias electrode 27 are incorporated. The details or the electrostatic chuck 17 be described later.

The cooling device (cooling section) 16 includes a coolant flow path 18a formed in the electrode unit body 18, and a coolant circulation device 21. The coolant circulation device 21 performs cooling by circulating the temperature-adjusted coolant in the coolant flow path 18a, and maintains the electrode unit 13 at a desired temperature.

The carrier 4 is placed on the electrode unit 13 of the stage 11 with the face holding the wafer 2 of the holding sheet 5 (adhesive face 5a) in an upward posture, and the non-adhesive face 5b of the holding sheet 5 comes into contact with the upper face of the electrode unit 13. The carrier 4 is placed in a predetermined position and posture with respect to the electrostatic chuck 17 of the electrode unit 13 by a conveyance mechanism not shown in the figure. Hereinafter, this predetermined position and posture are referred to as "normal position".

Figure 5:
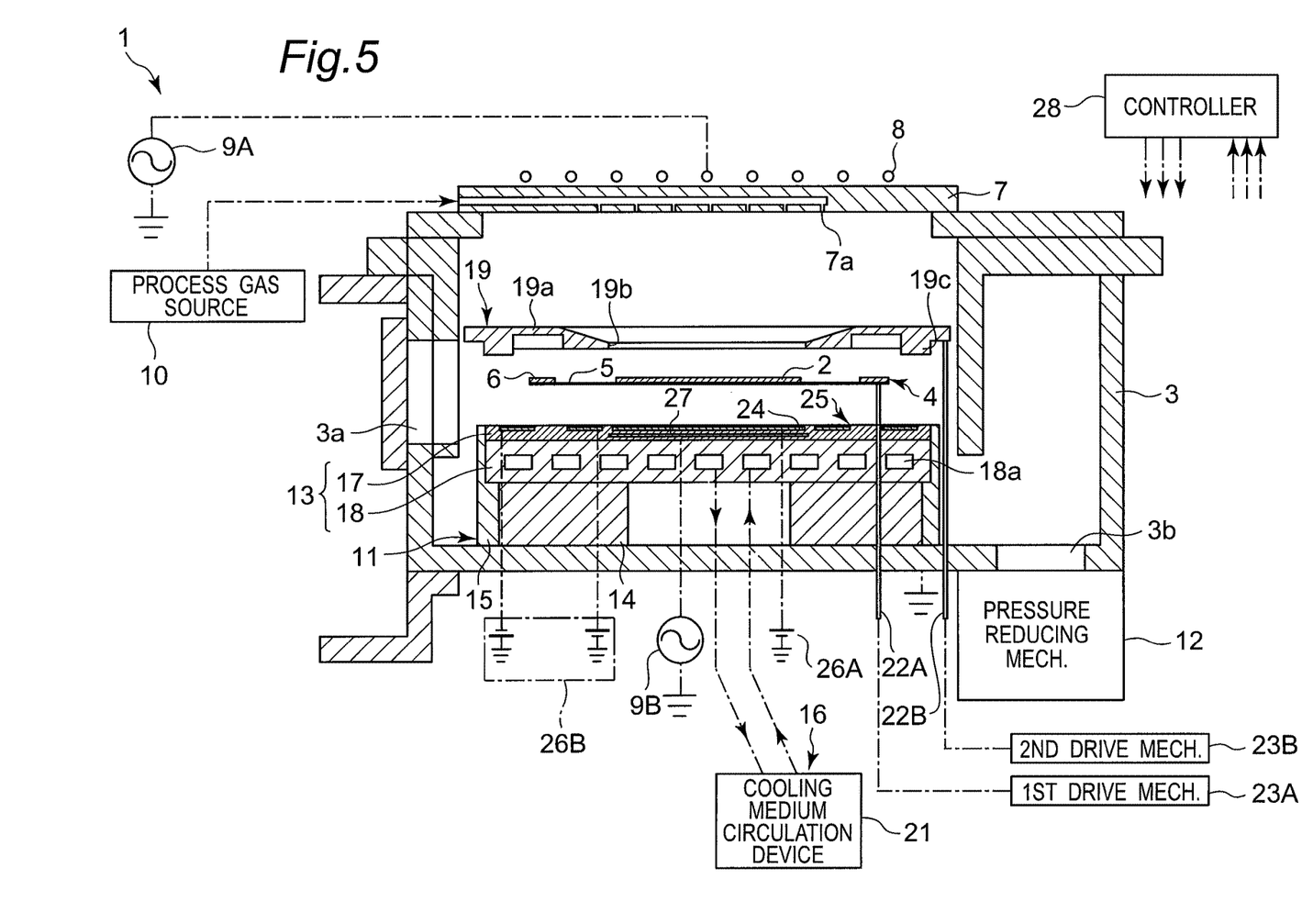
FIG. 5 is a sectional view of the plasma processing apparatus according to the first embodiment of the present invention (the cover is at a raised position)

The carrier 4 placed in the normal position is lifted by the first drive rod 22A and unloaded after the plasma process (See FIG. 5). The first drive rod 22A is vertically driven by the first drive mechanism 23A shown conceptually only in FIGS. 1 and 5. Specifically, the carrier 4 is made to move to the raised position shown in FIG. 5, and the lowered position shown in FIG. 1.

Referring to FIGS. 1 to 3, a cover 19 which moves up and down on the upper side of the stage 11 is disposed in the chamber 3. The rover 19 includes a body 19a having a thin circular outer contour, and a window 19b formed at the center of the body 19a so as to penetrate in the thickness direction. On the lower face of the body 19a, an annular protrusion portion 19c is formed so as to abut on the upper face of the electrostatic chuck 17 of the electrode unit 13 when the body 19a is lowered. The lower face of the annular protrusion portion 19c includes an annular contact face 19d having a predetermined width dimension in a radial direction. The cover 19 (body 19a) is made of a material such as a metal material including aluminum or aluminum alloy or the like, silicon carbide, aluminum nitride, and a ceramic material with excellent thermal conductivity.

The outer diameter dimension of the body 19a of the cover 19 is formed, to be sufficiently larger than the outer contour of the carrier 4. The reason why the body 19a covers the frame 6 and the holding sheet 5 (area between the outer peripheral part of the wafer 2 and the frame 6) of the carrier 4 during the plasma process is to protect the frame 6 and the holding sheet 5 from the plasma. The diameter of the window 19b of the cover 19 is set, for example, in the range of ±2 mm with respect to the outer diameter dimension of the wafer 2. During the plasma process, the wafer 2 is exposed to the internal space of the chamber 3 through the window 19b.

The vertical movement operation of the cover 19 is performed by a second drive rod 22B connected to the body 19a. The second drive rod 22B is vertically driven by a second drive mechanism 23B shown conceptually only in FIGS. 1 and 5. The cover 19 is raised and lowered by the vertical movement of the second drive rod 22B. Specifically, the cover 19 can move to the raised position shown in FIG. 5 and the lowered position shown in FIG. 1.

Referring to FIG. 5, the cover 19 in the raised position is located with a sufficient distance above the stage 11. Thus, when the cover 19 is in the raised position, it is possible to perform the operation to load the carrier 4 (holding the wafer 2) on the upper face of the electrostatic chuck 17 of the electrode unit 13, and oppositely the operation to unload the carrier 4 from the upper face of the electrode unit 13.

Referring to FIGS. 1 and 2, the cover 19 in the lowered position covers the holding sheet 5 (except the part holding the wafer) and the frame 6 in the carrier 4 in the normal position. In addition, when the cover 19 is in the lowered position, the lower face of annular protrusion portion 19c (the above-described contact face 19d) abuts on the upper face of the electrostatic chuck 17 of the electrode unit 13. That is, the second drive mechanism 23B functions as a means for raising and lowering the cover 19 with respect, to the stage 11, and also functions as a means for making the cover 19 come into and out of contact with the stage 11.

In the following, referring to FIGS. 1 and 2, the electrostatic chuck 17 or the electrode unit 13 will be described. In the following description, unless specifically mentioned, the carrier 4 holding the wafer 2 is assumed to be in the normal position (a state of being placed on the electrostatic chuck 17 in a predetermined position and posture).

In this embodiment, a whole of the upper face of the electrostatic chuck 17 (including an area on which the carrier 4 is placed and an area onto which the annular protrusion portion 19c of the cover 19 abuts) is substantially flat. Here, the term "substantially flat" means that it can be regarded as a flat surface except for a fine front-face roughness and unavoidable factors such as manufacturing tolerances.

Figure 4:
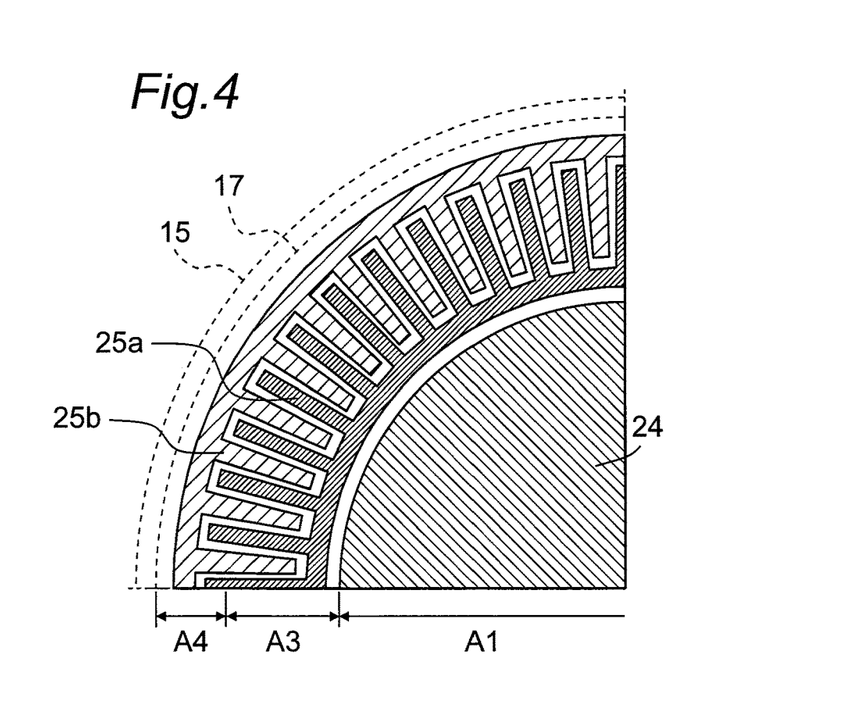
FIG. 4 is a partial enlarged view of first and second electrostatic attraction electrodes.

In the electrostatic chuck 17, in an adjacent area of the upper face of the central part, that is, the area in which the wafer 2 is placed via the holding sheet 5 (first area A1), a first electrostatic attraction electrode 24 of unipolar type is incorporated. As shown in FIG. 4, the first electrostatic attraction electrode 24 in this embodiment has a thin circular-disc shape with an outer diameter slightly larger than the wafer 2. A first DC power source 26A is electrically connected to the first electrostatic attraction electrode 24.

In the electrostatic chuck 17, a second electrostatic attraction electrode of bipolar type is incorporated in an adjacent area of the upper face in the outer peripheral part surrounding the central part. Specifically, the second electrostatic attraction electrode 25 is incorporated in an area (second area A2) including an area in which the frame 6 is placed via the holding sheet 5, an area (indicated by a reference sign A3 in FIG. 2) in which the holding sheet 5 between the wafer 2 and the frame 6 is placed, and an area (indicated by reference sign A4 in FIG. 2) in which the annular protrusion portion 19c of the cover 19 in the lowered position abuts. As shown in FIG. 4, the second electrostatic attraction electrode 25 includes an endless-shaped positive electrode 25a surrounding the first electrostatic attraction electrode 24, and an endless-shaped negative electrode 25b disposed outside the positive electrode 25a. The positive electrode 25a is electrically connected to the positive electrode of a second DC power source 26B, and the negative electrode 25b is electrically connected to the negative electrode of the second DC power source 26B. In this embodiment, both the positive electrode 25a and the negative electrode 25b of the second electrostatic attraction electrode have strip shapes that meander with constant widths.

In the electrostatic chuck 17, a bias 27 (RF electrode) is incorporated below the first electrostatic attraction electrode 24. The bias electrode 27 is electrically connected to the second radio frequency power source 9B for applying a bias voltage.

The controller 28 schematically shown in FIGS. 1 and 5 controls the operation of the each element which constitutes the dry etching apparatus 1. These elements include the first and second radio frequency power sources 9A and 9B, the process gas source 10, the pressure reducing mechanism 12, the first and second dc power sources 26A and 26B, the coolant circulation device 21, and the first and second drive mechanisms 23A and 23B.

Next, the operation of the dry etching apparatus 1 in this embodiment will be described.

First, the carrier 4 where the wafer 2 is adhered in the center of the holding sheet 5 is loaded to the internal space of the chamber 3, and placed in the normal position on the electrostatic chuck 17 by the conveyance mechanism not shown in the figure. In this case, the cover 19 is in the raised position (FIG. 5).

The second drive rod 22B is driven by the second drive mechanism 23B, and the cover 19 is lowered from the raised position (FIG. 5) to the lowered position (FIG. 1). When the cover 19 is in the lowered position, the frame 6 and the holding sheet 5 (the area between the wafer 2 and the frame 6) of the carrier 4 are covered with the cover 19, and the wafer 2 is exposed through the window 19b. In addition, the lower face of the annular protrusion portion 19c of the cover 19 (contact face 19d) comes into contact with the upper face of the electrostatic chuck 17 (an area indicated by the reference sign A4 in FIG. 2).

A direct current voltage is applied from die first DC power source 26A to the first electrostatic attraction electrode 24 of unipolar type, and the wafer 2 is held on the upper face of the electrostatic chuck 17 via the holding sheet 5 by the electrostatic attraction. In addition, a direct current voltage is applied from the second DC power source 26B to the second electrostatic attraction electrode 25 of bipolar type, and the frame 6 and the holding sheet 5 (the area between the wafer 2 and the frame 6) are held on the upper face of the electrostatic chuck 17 by the electrostatic attraction. In addition, by applying a direct current voltage from the second DC power source 26B to the bipolar second electrostatic attraction electrode 25, the cover 19 is electrostatically attracted to the upper face of the electrostatic chuck 17. In other words, the cover 19 is pressed onto the upper face of the electrostatic chuck 17 by the electrostatic attraction force.

Next, the process gas for plasma dicing is introduced to the chamber 3 from the process gas source 10, and at the same time, discharged by the pressure reducing mechanism 12 to maintain the inside of the chamber 3 at a predetermined pressure. After that, radio frequency power is supplied to the antenna 8 from the first radio frequency power source 9A to generate plasma inside the chamber 3, and the generated plasma is applied to the wafer 2 exposed through the window 19b of the cover 19. In this case, a bias voltage is applied from the second radio frequency power source 2B to the bias electrode 27. In addition, the cooling device 16 cools the stage 11 including the electrode unit 13. A part of the wafer 2, the part exposed through the mask (street), is removed in the front face 2a to the back face 2b by physicochemical action of radicals and, ions in the plasma, and the wafer 2 is divided into individual chips (individual pieces).

During the plasma dicing, the cover 19 is heated by exposure to plasma. However, the cover 19 is made of a material having high thermal conductivity, and the annular protrusion portion 19c is pressed onto the upper face of the electrostatic chuck 17 by the electrostatic attraction of the second electrostatic attraction electrode 25. Therefore, the heat generated in the cover 19 can be released to the stage 11 cooled by the cooling device 16. In other words, during the plasma dicing, the cover 19 is cooled by the heat conduction to the stage 11.

During the plasma dicing, the wafer 2 is electrostatically attracted to the upper face of the electrostatic chuck 17 by the first electrostatic attraction electrode 24 via the holding sheet 5. Further, during the plasma dicing, the frame 6 and the holding sheet 5 are electrostatically attracted to the upper surface of the electrostatic chuck 17 by the second electrostatic attraction electrode 25. Therefore, during the plasma dicing, the heat generated in the wafer 2, the frame 6, and the holding sheet 5 can be released to the stage 11 cooled by the cooling device 16. In other words, during the plasma dicing, the wafer 2, the frame 6, and the holding sheet 5 are cooled by the heat conduction to the stage 11.

As described above, the cover 19 itself heated by being exposed to plasma is cooled by the heat transfer to the stage 11, and in addition, the wafer 2, the frame 6, and the holding sheet 5 are also cooled by the heat transfer to the stage 11, and thereby, the thermal damage to the carrier 4 (sheet, frame and wafer) by the radiant heat from the cover 19 can be effectively prevented.

After the plasma dicing, the second drive rod 22B is driven by the second drive mechanism 23B, and the cover 19 is moved from the lowered position to the raised position. Then, the first drive rod 22A is driven by the first drive mechanism 23A, the carrier 4 is moved from the lowered position to the raised position, and the carrier 4 is conveyed from the chamber 3 by the conveyance mechanism not shown in the figure.

In this embodiment, as described above, the first electrostatic attraction electrode 24 of unipolar used for the electrostatic attraction of the wafer 2, on the other hand, the second electrostatic attraction electrode 25 of bipolar type is used for the electrostatic attraction of the carrier 4 (the frame 6 and the holding sheet 5) and the cover 19. This improves both the plasma process performance and the electrostatic attraction performance. In the following, the details on this point will be described.

The wafer 2 is electrostatically attracted to the electrostatic chuck 17 by the first electrostatic attraction electrode 24 of unipolar type. The electrostatic attraction electrode of unipolar type electrostatically attracting mainly by Coulomb force has a weaker electrostatic attraction force than that of bipolar type. However, the electrostatic attraction electrode of unipolar type can uniformly attract the entire face of the wafer, and therefore, in terms of the plasma process performance, the electrostatic attraction electrode of unipolar type is superior to that of bipolar type which performs electrostatic attraction by Johnsen-Rahbeck force due to the current mainly flowing through the back face of the holding sheet 5 and the wafer 2. For example, in the case of plasma dicing, both the attraction force fluctuation the before and after of singulating the wafer 2 and the difference of the localized attraction force of unipolar type are less than those of bipolar type. In addition, specifically, in the case of the process (Si etching process, for example) where the radical reaction of the high plasma density and the low bias power are dominant, with the change of the bias power of the before and after of singulating the wafer 2, the pattern of the electrostatic attraction electrode or bipolar type may be transcribed to the substrate side. On the other hand, the frame 6 and the cover 19 are electrostatically attracted to the electrostatic chuck 17 by the second electrostatic attraction electrode 25 of bipolar type. The electrostatic attraction electrode of bipolar type is inferior to that of unipolar type in terms of the plasma process performance, but is stronger than that of unipolar type in terms of the electrostatic attraction force. That is, in the present invention, the first electrostatic attraction electrode 24 of unipolar type is used for the electrostatic attraction of the wafer 2 which directly influences the plasma process performance, on the other hand, the second electrostatic attraction electrode 25 of bipolar type with the strong electrostatic attraction force is used for the conveyance frame 6 and the cover 19 with less influence on the plasma process performance than the wafer 2. As a result, both the plasma process performance and the electrostatic attraction performance can be improved. With the improvement of the electrostatic attraction performance, the carrier 4 and the cover 19 are cooled effectively by the heat transfer to the stage, and the damage caused by the radiant heat from the cover 19 can be reduced effectively.

In the following, other embodiments of the present invention will be described. The configuration and the operation not specifically mentioned in the description of these embodiments are the same as those of the first embodiment.

Second Embodiment

Figure 6:
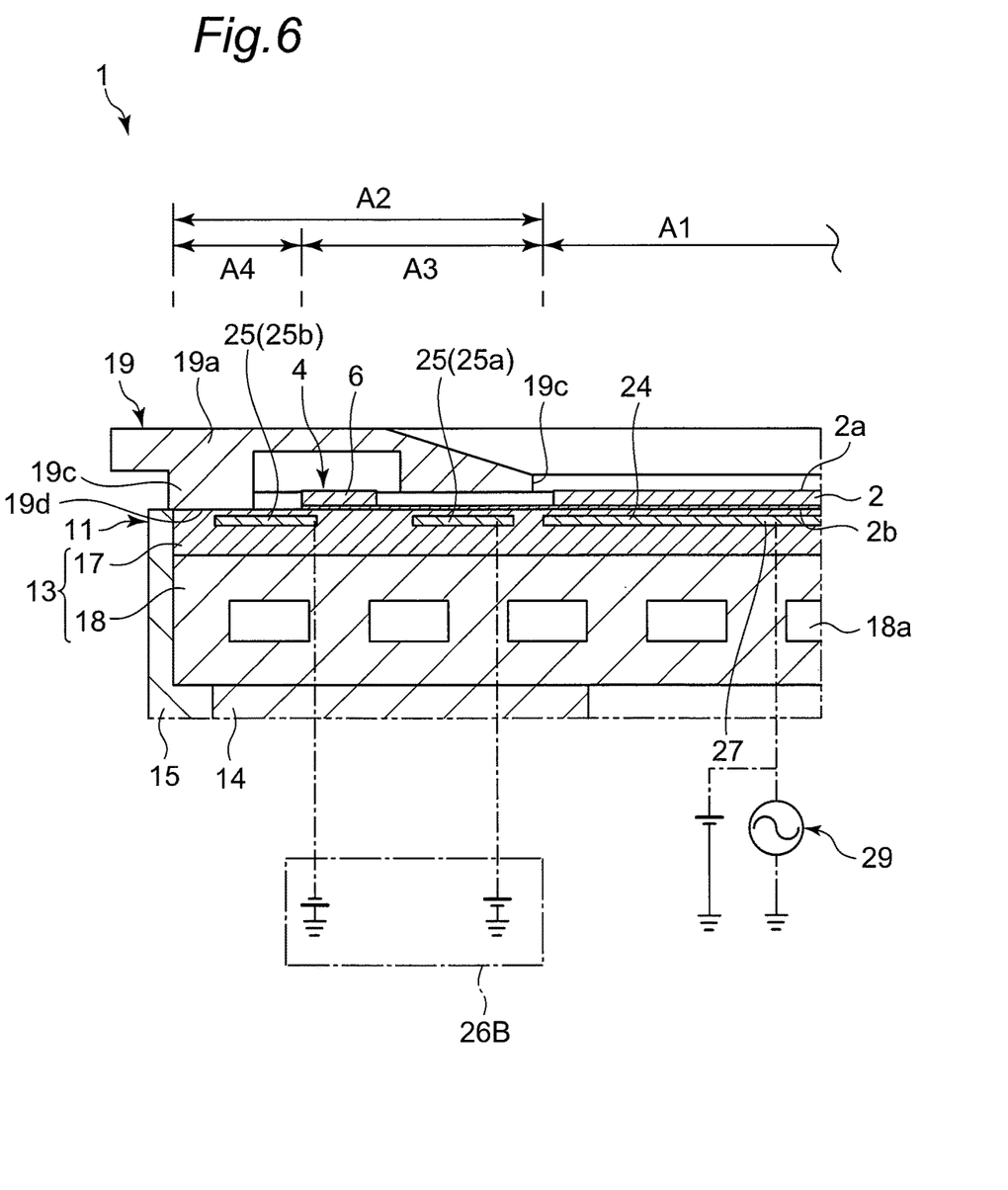
FIG. 6 is a partial sectional view of a plasma processing apparatus according to a second embodiment of the present invention.

In the second embodiment shown in FIG. 6, the bias electrode 27 and the second radio frequency power source 9B are eliminated, and a voltage obtained by superimposing a radio frequency voltage as a bias voltage on a direct current voltage is applied from the power source 29 to the first electrostatic attraction electrode 24. By eliminating the second radio frequency power source 9B, the configuration of the electrostatic chuck 17 can be simplified.

Third Embodiment

Figure 7:
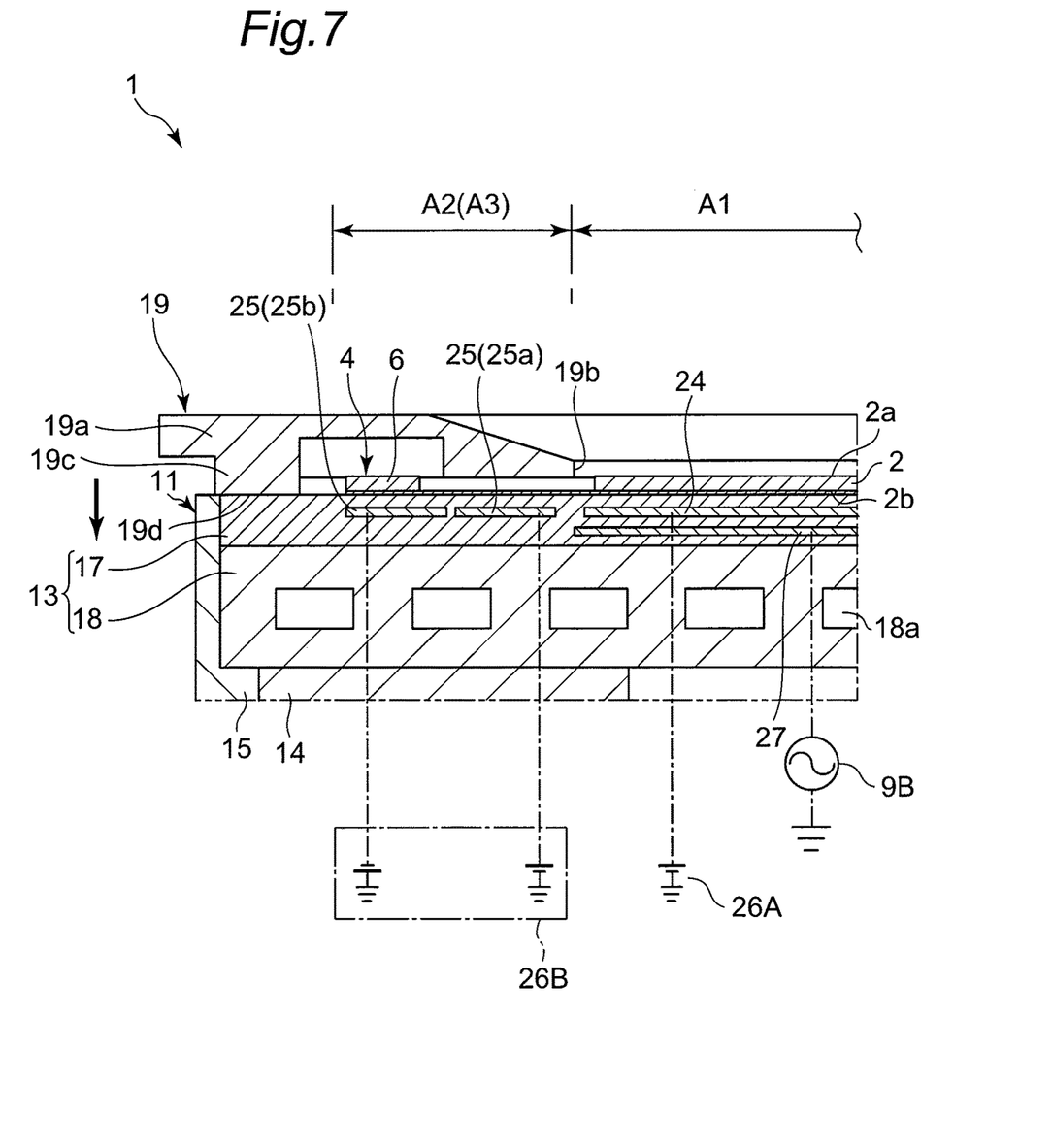
FIG. 7 is a partial sectional view of a plasma processing apparatus according to a third embodiment of the present invention.

In the third embodiment shown in FIG. 7, the second electrostatic attraction electrode 25 is disposed only in the area including the area in which the frame 6 is placed via the holding sheet 5 and the area in which the holding sheet 5 between the wafer 2 and the frame 6 is placed on the electrostatic chuck 17. In other words, the second electrostatic attraction electrode 25 is not disposed in the area (indicated by the reference sign A4 in FIG. 7) in which the cover 19 in the lowered position abuts onto the electrostatic chuck 17, and the cover 19 is not electrostatically attracted to the electrostatic chuck 17. During the plasma process, the cover 19 is urged to the stage 11 side by the second drive mechanism 23B, and whereby the contact face 19d of the annular protrusion portion 19c is pressed onto the upper face of the electrostatic chuck 17.

The present invention is not limited to the configurations in the embodiments, and various modifications are possible.

For example, by raising and lowering the stage 11 with respect to the cover 19 which is fixed in the chamber 3, a configuration that the cover 19 comes into and out of contact with the stage 11 can be adopted.

In addition, the present invention is described using a dry etching apparatus of ICP type as an example, but the present invention can also be applied to a dry etching apparatus of parallel-plate type. In addition, the present invention can also be applied to other plasma processing apparatuses such as a CVD apparatus limited to the dry etching apparatus.

What is claimed is:

1. A plasma processing apparatus for plasma processing a substrate held by a carrier having a frame and a holding sheet, comprising:
   a chamber having a pressure reducible internal space;
   a gas inlet port configured to supply a process gas into the internal space;
   a vacuum pump configured to reduce pressure of the internal space;
   an antenna and a radio frequency power source connected to the antenna configured to generate plasma in the internal space; and
   a stage provided in the chamber, the stage including an electrode unit on which the carrier is placed;
   wherein the electrode unit comprises:
     an electrostatic chuck; and
     an electrode unit body in which a coolant flow path to cool the electrode unit is formed, the electrode unit body being made of metal, and the electrode unit body being disposed on a lower side of the electrostatic chuck,
   wherein the carrier is placed on a central part of an upper face of the electrostatic chuck such that the carrier exposes an outermost area of the upper face of the electrostatic chuck, an area of the upper face of the electrostatic chuck upon which the carrier is placed being equal to an area of the carrier and smaller than a whole of the upper face of the electrostatic chuck.

2. The plasma processing apparatus according to claim 1, wherein the electrode unit supports and cools all of a surface of the carrier placed on the central part of an upper face of the electrostatic chuck.

3. The plasma processing apparatus according to claim 1, wherein the electrostatic chuck of the electrode unit is larger than the substrate.

4. The plasma processing apparatus according to claim 1, further comprising:
   a first electrostatic attraction electrode of unipolar type incorporated in a first area of the electrostatic chuck, the first area being an area in which the substrate is placed via the holding sheet; and
   a second electrostatic attraction electrode of bipolar type which is incorporated in a second area of the electrostatic chuck and to which a direct current voltage is applied, the second area including at least an area in which the frame is placed via the holding sheet and an area in which the holding sheet between the substrate and the frame is placed.

5. The plasma processing apparatus according to claim 4, further comprising a cover capable of coming into and out of contact with the stage, the cover comprising:
   a body covering the holding sheet and the frame of the carrier placed on the central part of the upper face of the electrostatic chuck; and
   a window formed to penetrate the body in a thickness direction so as to expose the substrate held in the carrier placed on the central part of the upper face of the electrostatic chuck to the internal space.

6. The plasma processing apparatus according to claim 5, wherein the second area of the electrostatic chuck includes an area in which the cover abuts on the electrostatic chuck.

7. The plasma processing apparatus according to claim 4, wherein a direct current voltage is applied to the first electrostatic attraction electrode.

8. The plasma processing apparatus according to claim 4, wherein a voltage obtained by superimposing a radio frequency voltage on a direct current voltage is applied to the first electrostatic attraction electrode.

9. The plasma processing apparatus according to claim 4, wherein the second electrostatic attraction electrode being disposed without overlapping the substrate.

10. The plasma processing apparatus according to claim 1, further comprising a cover, the cover comprising:
- a body covering the holding sheet and the frame of the carrier placed on the central part of the upper face of the electrostatic chuck; and
- a window formed to penetrate the body in a thickness direction so as to expose the substrate held in the carrier placed on the central part of the upper face of the electrostatic chuck to the internal space.

11. The plasma processing apparatus according to claim 1, wherein a portion of the coolant flow path is located between the whole of the upper face of the electrostatic chuck and the central part of the upper face of the electrostatic chuck, upon which the carrier is placed.

\* \* \* \* \*